(12) United States Patent
Sakurada

(10) Patent No.: US 7,518,187 B2
(45) Date of Patent: Apr. 14, 2009

(54) SOI WAFER AND A METHOD FOR PRODUCING THE SAME

(75) Inventor: Masahiro Sakurada, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 125 days.

(21) Appl. No.: 10/546,693

(22) PCT Filed: Mar. 12, 2004

(86) PCT No.: PCT/JP2004/003347

§ 371 (c)(1),
(2), (4) Date: Aug. 22, 2005

(87) PCT Pub. No.: WO2004/084308

PCT Pub. Date: Sep. 30, 2004

(65) Prior Publication Data

US 2006/0086313 A1    Apr. 27, 2006

(30) Foreign Application Priority Data

Mar. 18, 2003   (JP) .............................. 2003-073768

(51) Int. Cl.
*C30B 13/00* (2006.01)
*H01L 29/94* (2006.01)
*H01L 21/331* (2006.01)

(52) U.S. Cl. ........................ 257/347; 117/43; 438/311

(58) Field of Classification Search .................... 117/43; 257/347; 438/311
See application file for complete search history.

(56) References Cited

U.S. PATENT DOCUMENTS

| 6,083,324 A * | 7/2000 | Henley et al. ............... 148/33.2 |
| 6,180,497 B1 * | 1/2001 | Sato et al. .................... 438/458 |
| 6,350,703 B1 * | 2/2002 | Sakaguchi et al. .......... 438/766 |

(Continued)

FOREIGN PATENT DOCUMENTS

JP    A 10-79498    3/1998

(Continued)

OTHER PUBLICATIONS

Dupret et al., "Global modelling of heat transfer in crystal growth furnaces," Int. J. Heat Mass Transfer, vol. 33, No. 9, pp. 1849-1871, 1990.

*Primary Examiner*—Robert M Kunemund
*Assistant Examiner*—G. Nagesh Rao
(74) *Attorney, Agent, or Firm*—Oliff & Berridge, PLLC

(57) ABSTRACT

The present invention is an SOI wafer in which at least a silicon active layer is formed over a support substrate via an insulator film or on a support substrate directly, wherein, at least, the silicon active layer consists of a P(phosphorus)-doped silicon single crystal grown by Czochralski method, which is occupied by N region and/or defect-free I region, and contains Al (aluminum) with concentration of $2 \times 10^{12}$ atoms/cc or more. There can be provided with ease and at low cost an SOI wafer with high electrical reliability in a device fabrication process, that has an excellent electric property without generation of micro pits by cleaning with hydrofluoric acid etc. even in the case of forming an extremely thin silicon active layer, or that retains high insulation property even in the case of forming an extremely thin inter-layer insulator film.

26 Claims, 6 Drawing Sheets

U.S. PATENT DOCUMENTS

| | | | |
|---|---|---|---|
| 6,548,382 B1 * | 4/2003 | Henley et al. | 438/526 |
| 6,653,209 B1 * | 11/2003 | Yamagata | 438/459 |
| 6,890,838 B2 * | 5/2005 | Henley et al. | 438/475 |
| 2002/0022348 A1 * | 2/2002 | Sakaguchi et al. | 438/480 |
| 2002/0173086 A1 * | 11/2002 | Dietrich et al. | 438/151 |
| 2003/0116082 A1 * | 6/2003 | Sakurada et al. | 117/20 |
| 2005/0032331 A1 * | 2/2005 | Nakano | 438/459 |
| 2006/0065184 A1 * | 3/2006 | Sakurada et al. | 117/19 |
| 2006/0086313 A1 * | 4/2006 | Sakurada | 117/89 |

FOREIGN PATENT DOCUMENTS

| | | |
|---|---|---|
| JP | A 11-40786 | 2/1999 |
| JP | A 11-297583 | 10/1999 |
| JP | A 2000-351690 | 12/2000 |
| JP | A 2001-44398 | 2/2001 |
| JP | A 2001-146498 | 5/2001 |

* cited by examiner

SOI WAFER AND A METHOD FOR PRODUCING THE SAME

TECHNICAL FIELD

The present invention relates to an SOI (Silicon On Insulator) wafer, more particularly, to an SOI wafer having extremely high electrical reliability, and to a method for producing such an SOI wafer.

BACKGROUND TECHNOLOGY

Conventionally, as a substrate for a device, an SOI wafer in which a silicon active layer (an SOI layer) is formed on a support substrate has been widely utilized. As a method for producing such an SOI wafer, for example, it is known that there are a SIMOX (Separation by Ion-Implanted Oxygen) method in which oxygen is implanted into a silicon wafer to form a silicon active layer insulated by an oxide film, and a bonding method in which two wafers are bonded together via an oxide film or directly.

In the SIMOX method, oxygen ions are implanted inside a silicon wafer from one of the main surfaces of the wafer that was subjected to mirror polishing and the like, to form oxygen ions implanted layer. Then, the wafer is subjected to heat-treatment, for example, under an inert gas atmosphere with temperature of 1300° C. or more, to transform the oxygen ions implanted layer formed inside the wafer into a buried oxide film layer (an insulator film layer). Thereby, an SOI wafer that is insulated by the insulator film layer in one wafer is obtained.

In addition, in an ion implantation delamination method which is one of the bonding methods, an insulator film such as an oxide film (also refers to as a buried insulator film or inter-layer insulator film) is formed on a surface of a silicon wafer (a bond wafer) to be a silicon active layer or on a surface of a silicon wafer (a base wafer) to be a support substrate, and an ion-implanted layer (a micro bubble layer) is formed inside the bond wafer by implanting ions such as hydrogen from one side surface of the bond wafer. Further, after the ion-implanted surface of the bond wafer is bonded to the base wafer via the oxide film, the bond wafer is delaminated at the ion-implanted layer as a boundary by heat treatment. Thereby, an SOI wafer in which a thin silicon active layer is formed over the base wafer via the oxide film can be obtained.

Further, there are also some cases that an insulator support substrate is used and a bond wafer is bonded to this directly, i.e., without an oxide film.

Further, after delaminating the bond wafer at the ion-implanted layer as a boundary, there are also some cases that heat treatment (bonding heat treatment) for making bonding strength between the silicon active layer and the base wafer sufficient, or cleaning with hydrofluoric acid for removing an oxide film on the surface is performed.

In the case of producing an SOI wafer as described above, as a silicon wafer, it has been conventional to use a silicon wafer on the surface of which micro pit defects with a size of 50 nm or more existed. However, in recent years, the demand for thinning the silicon active layer and the buried oxide film increases, and the demand for quality of a silicon wafer applicable to this has also become strict.

Especially, in the method for producing an SOI wafer such as the ion implantation delamination method, there are also some cases that cleaning with hydrofluoric acid for removing an oxide film on the surface is performed. At that time, there occurs many failures that the size of the micro pit defects existing on the surface of the silicon active layer is further enlarged by etching, the buried oxide film is etched by hydrofluoric acid infiltrated through the pit and the silicon active layer or the buried oxide film is destroyed almost entirely or partially.

Then, in order to reduce defects in the silicon active layer, there has been proposed the use of an epitaxial layer, a DZ (Denuded Zone) layer of an IG wafer or a silicon single crystal in so-called a neutral region (N region) where there exist no defects caused during growth of the single crystal which is called grown-in defects such as FPD, LSTD and COP.

For example, there has been proposed a method for producing an SOI wafer by forming an epitaxial layer on a silicon wafer (a bond wafer), implanting boron ions into the epitaxial layer, subsequently bonding the wafer to a support substrate via an oxide film, and further grinding and polishing the back surface of the bond wafer (for example, see Japanese Patent Laid-open (Kokai) No. 10-79498).

However, in the case of using the wafer on which the epitaxial layer is formed as the bond wafer as described above, defects in the silicon active layer can be improved, but there has been a problem that the production cost remarkably increases because the process for growing the epitaxial layer is added.

On the other hand, as a bond wafer, in the case of using a silicon wafer grown in N region where no micro defect such as FPD and COP exists, although it is required to accurately control growth conditions of a silicon single crystal, there is an advantage that the process for forming the epitaxial layer is not needed.

A method for producing a silicon single crystal will be explained herein, and then grown-in defects and N region will be explained.

As a method for producing a silicon single crystal, Czochralski Method (referred to as CZ method for short hereafter) is mainly used.

When producing a single crystal by CZ method, for example, an apparatus 10 for producing a single crystal as shown in FIG. 2 is used to produce the single crystal. This apparatus 10 for producing a single crystal has a member for containing and melting a polycrystalline material such as silicon, heat insulation members to insulate heat, and etc. They are installed in a main chamber 11. A pulling chamber 12 extending upwardly is continuously provided from a ceiling portion of the main chamber 11, and a mechanism (not shown) for pulling a single crystal 13 by a wire 14 is provided above it.

In the main chamber 11, a quartz crucible 16 for containing a melted raw material melt 15 and a graphite crucible 17 supporting the quartz crucible 16 are provided, and these crucibles 16 and 17 are supported by a shaft 18 so that they can be rotated and moved upwardly or downwardly by a driving mechanism (not shown). To compensate for decline of the melt level of the raw material melt 15 caused by pulling of the single crystal 13, the driving mechanism for the crucibles 16 and 17 is designed to rise the crucibles 16 and 17 as much as the melt level declines.

And, a graphite heater 19 for melting the raw material is provided so as to surround the crucibles 16 and 17. A heat insulating member 20 is provided outside the graphite heater 19 so as to surround it in order to prevent that the heat from the graphite heater 19 is directly radiated on the main chamber 11.

Moreover, a graphite cylinder 23 is provided above the crucibles, and a heat insulating material 24 is provided on the outside of the lower end of the graphite cylinder 23 so as to oppose to the raw material melt 15 so that the heat radiation from the melt surface is intercepted and the temperature of the raw material melt surface is kept.

A raw material lump is put in the quartz crucible 16 installed in the apparatus for producing a single crystal as described above, the crucible 16 is heated by the graphite heater 19 as described above to melt the raw material lump in the quartz crucible 16. A seed crystal 22 fixed by a seed holder 21 connected with the lower end of the wire 14 is immersed into the raw material melt 15 melted from the raw material lump as described above. Thereafter, the single crystal 13 having a desired diameter and quality is grown under the seed crystal 22 by rotating and pulling the seed crystal 22. In this case, after bringing the seed crystal 22 into contact with the raw material melt 15, so-called necking, once forming a neck portion by narrowing the diameter to about 3 mm, is performed, and then, a dislocation-free crystal is pulled by spreading to a desired diameter.

Next, grown-in defects and N region will be explained.

It is known that in the case of changing a growth rate F from high rate to low rate in the direction of a crystal growth axis in a CZ pulling apparatus with a usual furnace structure (hot zone: HZ) having a large G which is an average value of a temperature gradient in the crystal along a pulling axis from the melting point of silicon to 1400° C., a defect distribution diagram as shown in FIG. 4 can be obtained.

In FIG. 4, V region is a region that contains a large amount of vacancies, i.e., depressions, pits, or the like caused by lack of silicon atoms, and I region is a region that contains a large amount of dislocations or clusters of excess silicon atoms caused by existence of excess silicon atoms. It has also been confirmed that there exists a neutral (hereinafter occasionally abbreviated as N) region that contains no (or little) lack or excess of the atom between V region and I region, and defects called OSF (Oxidation Induced Stacking Fault) are distributed in a ring shape (hereinafter occasionally referred to as OSF ring) near a boundary of V region when observed in the cross section perpendicular to a crystal growth axis.

When the growth rate is relatively high, there exist grown-in defects such as FPD, LSTD and COP, which are considered due to voids consisting of agglomerated vacancy-type point defects, at a high density over the entire radial direction of the crystal, and the region containing these defects becomes V region. Further, along with lowering of the growth rate, the OSF ring is generated from the periphery of the crystal. There exist at a low density outside the OSF ring, L/D (Large Dislocation: an abbreviation for interstitial dislocation loop, such as LSEPD, LFPD and the like) defects (huge dislocation clusters) which are considered due to dislocation loops consisting of agglomerated interstitial silicon atoms, and the region where these defects exist becomes I region (occasionally referred to as L/D region). When the growth rate is further lowered, the OSF ring shrinks to the center of the wafer and disappears, so that the entire plane becomes I region.

N region located between the V region and the I region and outside the OSF ring becomes a region containing no FPD, LSTD and COP to be generated due to voids as well as no LSEPD and LFPD to be generated due to interstitial silicon atoms. In addition, it has been recently found that when further classifying N region, as shown in FIG. 4, there exist Nv region (the region where a lot of vacancies exist) adjacent to the outside of OSF ring and Ni region (the region where a lot of interstitial silicon atoms exist) adjacent to I region, and that when performing thermal oxidation treatment, a lot of oxygen precipitates are generated in the Nv region and little oxygen precipitates are generated in the Ni region.

Although such an N region conventionally existed only in a part of a plane of wafer, a crystal having N region over the entire radial plane (the entire plane of a wafer) has been able to be manufactured by controlling F/G that is a ratio of a pulling rate (F) to an average value (G) of a temperature gradient in the crystal along a pulling axis from the melting point of silicon to 1400° C.

Also, in the manufacture of an SOI wafer, as described above, there has been proposed a method in which a silicon single crystal wafer having N region over the entire surface is used as a bond wafer.

For example, there has been proposed an SOI wafer wherein a silicon single crystal is pulled by controlling a ratio (F/G) of the pulling rate F to the average value G of a temperature gradient in the crystal along a pulling axis from the melting point of silicon to 1400° C. within a predetermined range when it is pulled by Czochralski method (CZ method), and the silicon wafer in N region is used as a bond wafer (for example, see Japanese Patent Laid-open (Kokai) No. 2001-146498 and Japanese Patent Laid-open (Kokai) No. 2001-44398).

However, when a silicon single crystal in N region is pulled by CZ method with controlling the pulling rate and the like, this silicon single crystal in N region is grown in a range of a relatively limited pulling rate. Thus, there occurs a problem that it is difficult to control the pulling rate and productivity and yield of the single crystal become low. Therefore, an SOI wafer using such a single crystal in N region becomes relatively expensive.

On the other hand, as to a base wafer, it is originally required for supporting a silicon active layer via an insulator film, thus, no device is directly formed on a surface of the base wafer.

Therefore, as a base wafer, considering improvements of productivity etc., a silicon wafer that is produced by growing a silicon single crystal occupied by V region or partially OSF region and Nv region with high pulling rate as shown in FIG. 4, and then being processed to have a mirror surface from the above silicon single crystal grown with high pulling rate has been widely used. For example, there has been proposed to use a dummy-grade silicon wafer of which resistivity and the like do not meet product standards as a base wafer (for example, see Japanese Patent Laid-open (Kokai) No. 11-40786).

However, thinning of an inter-layer insulator film has been recently demanded, thus improving quality of a silicon wafer used as a base wafer has been demanded. That is, in the case that a thickness of an inter-layer insulator film is thick enough, there is no need to care about influences leading to dielectric breakdown even if vacancy defects like COPs that voids have grown are formed on a surface of a base wafer with high density. However, in the case that an inter-layer insulator film has a thin thickness of 100 nm or less, it is concerned that quality of the inter-layer insulator film may be deteriorated and insulation function may be in trouble.

Further, as a method for providing an SOI wafer at lower cost that is prone to be expensive, there has been proposed a method in which a delaminated wafer that is delaminated from a silicon active layer by ion implantation delamination method is reused as a base wafer (see Japanese Patent Laid-open (Kokai) No. 11-297583). However, as it has been recently demanded, in the case that an inter-layer insulator film of an SOI wafer has a thin thickness of, for example, 100 nm or less, if a delaminated wafer to be reused as a base wafer includes regions like V region, OSF region and huge dislocation clusters (LSEPD, LFPD), quality of the inter-layer insulator film comes to be deteriorated and insulation function becomes insufficient. Therefore, in this case, it is difficult to reuse as a base wafer.

DISCLOSURE OF THE INVENTION

The present invention was accomplished in view of the aforementioned circumstances, and its object is to provide with ease and at low cost an SOI wafer that has an excellent electric property without generation of micro pits by cleaning with hydrofluoric acid etc. even in the case of forming an extremely thin silicon active layer, for example, with a thickness of 200 nm or less, or that retains high insulation property and has high electrical reliability in a device fabrication process even in the case of forming an extremely thin inter-layer insulator film, for example, with a thickness of 100 nm or less.

The present invention was accomplished to achieve the aforementioned object, and there is provided an SOI wafer in which at least a silicon active layer is formed over a support substrate via an insulator film or on a support substrate directly, wherein, at least, the silicon active layer consists of a P(phosphorus)-doped silicon single crystal grown by Czochralski method, which is occupied by N region and/or defect-free I region, and contains Al (aluminum) with concentration of $2 \times 10^{12}$ atoms/cc or more.

As described above, in the case of the SOI wafer of which, at least, the silicon active layer consists of a P(phosphorus)-doped silicon single crystal grown by Czochralski method, which is occupied by N region and/or defect-free I region, and contains Al (aluminum) with concentration of $2 \times 10^{12}$ atoms/cc or more, there does not exist even an extremely fine defect in the silicon active layer. And therefore, no micro pits are generated even when it is cleaned with hydrofluoric acid and it becomes the SOI wafer having an excellent electric property. Further, since such an SOI wafer can be produced without adding a process as in the case of using an epitaxial-wafer and the like, and a defect-free silicon single crystal to be a silicon active layer can be produced with ease and at low cost, production cost can be lowered.

In addition, a support substrate in these cases is properly selected from silicon, quartz, SiC and sapphire etc.

Also, there is provided an SOI wafer in which a base wafer and a bond wafer respectively consisting of silicon single crystal are bonded via an insulator film, and then the bond wafer is thinned to form a silicon active layer, wherein the bond wafer and/or the base wafer consists of a P-doped silicon single crystal grown by Czochralski method, which is occupied by N region and/or defect-free I region, and contains Al with concentration of $2 \times 10^{12}$ atoms/cc or more.

As described above, in the case of the SOI wafer of which the bond wafer consists of a P-doped silicon single crystal grown by Czochralski method, which is occupied by N region and/or defect-free I region, and contains Al with concentration of $2 \times 10^{12}$ atoms/cc or more, there does not exist even an extremely fine defect in the silicon active layer formed by thinning the bond wafer. And therefore, no micro pits are generated even when it is cleaned with hydrofluoric acid and it becomes the SOI wafer having an excellent electric property. Further, since such an SOI wafer can be produced without adding a process as in the case of using an epitaxial-wafer and the like, and a defect-free silicon single crystal to be used as a bond wafer can be produced with ease and at low cost, production cost can be lowered.

Further, in the case of the SOI wafer of which the base wafer consists of a P-doped silicon single crystal grown by Czochralski method, which is occupied by N region and/or defect-free I region, and contains Al with concentration of $2 \times 10^{12}$ atoms/cc or more, there does not exist micro defects on the surface of the base wafer. And therefore, even in the case of forming an extremely thin inter-layer insulator film, for example, with a thickness of 100 nm or less, degradation of dielectric breakdown property due to effect of the defects on the surface of the base wafer is not arisen, and such an SOI wafer has high electrical reliability in a device fabrication process. In the case of such an SOI wafer, since a defect-free silicon single crystal used as a base wafer can be produced with ease and at low cost, production cost can be lowered.

In these cases, it is preferable that the P-doped silicon single crystal contains P with concentration of $1 \times 10^{14}$ atoms/cc or more.

As described above, in the case that the P-doped silicon single crystal contains P with concentration of $1 \times 10^{14}$ atoms/cc or more, there can be sufficiently obtained an N-type of conductivity.

In these cases, the silicon active layer can have a thickness in the range of 5 nm to 200 nm.

In recent years, the silicon active layer has been required to be thinner. Since there hardly exist even an extremely fine defect in the silicon active layer of the SOI wafer according to the present invention, even if a thickness of the silicon active layer is 200 nm or less, it is prevented that the silicon active layer is destroyed due to enlargement of defects by cleaning with hydrofluoric acid and the like, so that there can be obtained an SOI wafer with high quality.

In these cases, the insulator film is a silicon oxide film and has a thickness in the range of 10 nm to 100 nm.

In recent years, the thickness of the inter-layer insulator film consisting of a silicon oxide film has been required to be 100 nm or less. In the case of producing an SOI wafer according to the present invention, dielectric breakdown property is not deteriorated even if such an extremely thin oxide film is formed, and high insulation property is retained.

As a method according to the present invention, there is provided a method for producing an SOI wafer in which at least an insulator film layer (an oxide film layer) is formed by implanting oxygen into a silicon wafer and then performing heat-treatment, to form a silicon active layer insulated by the insulator film layer in the wafer, wherein at least a silicon wafer which consists of a P-doped silicon single crystal grown by Czochralski method, which is occupied by N region and/or defect-free I region, and contains Al with concentration of $2 \times 10^{12}$ atoms/cc or more is used as the silicon wafer.

As described above, in the case that an SOI wafer is produced by the SIMOX method, by using a silicon wafer consisting of a P-doped silicon single crystal, which is occupied by N region and/or defect-free I region, and contains Al with concentration of $2 \times 10^{12}$ atoms/cc or more, there can be obtained an SOI wafer of which the silicon active layer is extremely high quality. Further, since such an SOI wafer can be produced without adding a process, and a defect-free silicon single crystal to be used can be produced with ease and at low cost, production cost can be lowered.

As a method according to the present invention, there is also provided a method for producing an SOI wafer at least comprising steps of, a bonding step bonding a base wafer and a bond wafer directly and a thinning step forming a silicon active layer by thinning the bond wafer, wherein an insulator substrate is used as the base wafer and a silicon wafer which consists of a P-doped silicon single crystal grown by Czochralski method, which is occupied by N region and/or defect-free I region, and contains Al with concentration of $2 \times 10^{12}$ atoms/cc or more is used as the bond wafer.

As described above, in the case of producing an SOI wafer by a bonding method wherein an insulator substrate such as quartz, SiC and sapphire is used as a base wafer, and this base wafer and a bond wafer consisting of a silicon single crystal is bonded directly, a silicon wafer which consists of a P-doped silicon single crystal, which is occupied by N region and/or defect-free I region, and contains Al with concentration of $2 \times 10^{12}$ atoms/cc or more is used as the bond wafer. Thereby, an SOI wafer in which a silicon active layer on the insulator substrate has extremely high quality can be obtained. Further, since such an SOI wafer can be produced without adding a process, and a defect-free silicon single crystal to be used can be produced with ease and at low cost, production cost can be lowered.

Further, as a method according to the present invention, there is provided a method for producing an SOI wafer at least comprising steps of, a bonding step bonding a base wafer and a bond wafer respectively consisting of silicon single crystal via an insulator film and a thinning step forming a silicon active layer by thinning the bond wafer, wherein a silicon wafer which consists of a P-doped silicon single crystal grown by Czochralski method, which is occupied by N region and/or defect-free I region, and contains Al with concentration of $2 \times 10^{12}$ atoms/cc or more is used as the bond wafer and/or the base wafer.

As described above, in the case of producing an SOI wafer by a bonding method wherein a base wafer and a bond wafer respectively consisting of silicon single crystal are bonded via an insulator film, a silicon wafer which consists of a P-doped silicon single crystal, which is occupied by N region and/or defect-free I region, and contains Al with concentration of $2 \times 10^{12}$ atoms/cc or more is used as the bond wafer and/or the base wafer. Thereby, an SOI wafer of which a silicon active layer and/or a support substrate has extremely high quality can be obtained. Further, since such an SOI wafer can be produced without adding a process, and a defect-free silicon single crystal to be used can be produced with ease and at low cost, production cost can be lowered.

In this bonding method, ahead of the bonding step, ion implanting step is performed to form an ion implanted layer in the bond wafer by implanting at least one type of ion among hydrogen ion and rare gas ions from the surface of the bond wafer, in the bonding step, the surface of the ion-implanted side of the bond wafer and the surface of the base wafer are bonded directly or via the insulator film, and in the thinning step, a part of the bond wafer is delaminated at the ion-implanted layer by heat-treatment. Thereby, an SOI wafer can be produced.

As described above, when an SOI wafer is produced by the ion implantation delamination method, a silicon active layer can be formed with extremely thin and uniform thickness, and an SOI wafer without defects and with extremely high quality can be obtained.

In these cases, as the P-doped silicon single crystal, a crystal containing P with concentration of $1 \times 10^{14}$ atoms/cc or more is preferably used.

As described above, in the case that the P-doped silicon single crystal contains P with concentration of $1 \times 10^{14}$ atoms/cc or more, there can be sufficiently obtained an N-type of conductivity.

In these cases, the silicon active layer can have a thickness in the range of 5 nm to 200 nm.

In recent years, the silicon active layer have been required to be thinner. In the case that an SOI wafer is produced according to the method of the present invention, there hardly exist even an extremely fine defect in the silicon active layer. Thus, even if a thickness of the silicon active layer is 200 nm or less, it is prevented that the silicon active layer is destroyed due to enlargement of defects by cleaning with hydrofluoric acid and the like, so that there can be obtained an SOI wafer with high quality.

In these cases, the insulator film may be a silicon oxide film and may have a thickness in the range of 10 nm to 100 nm.

In recent years, the thickness of the inter-layer insulator film consisting of silicon oxide film has been required to be 100 nm or less. In the case of producing an SOI wafer according to the present invention, even if such an extremely thin silicon oxide film is formed, dielectric breakdown property is not deteriorated and high insulation property is retained.

As explained above, according to the present invention, there is provided an SOI wafer wherein a silicon active layer and/or a support substrate consist of a P-doped silicon single crystal, which is occupied by N region and/or defect-free I region, and contains Al with concentration of $2 \times 10^{12}$ atoms/cc or more. In such an SOI wafer, even in the case that a silicon active layer having an extremely thin thickness like 200 nm or less is formed, the SOI wafer has an excellent electric property without generation of micro pits by cleaning with hydrofluoric acid etc., or the SOI wafer retains excellent insulation property even if an insulator film has a thickness like 100 nm or less. Therefore, when a device is fabricated by using such an SOI wafer, a device having an excellent electric property can be fabricated with high yield as well as with ease and at low cost.

Figure 1:
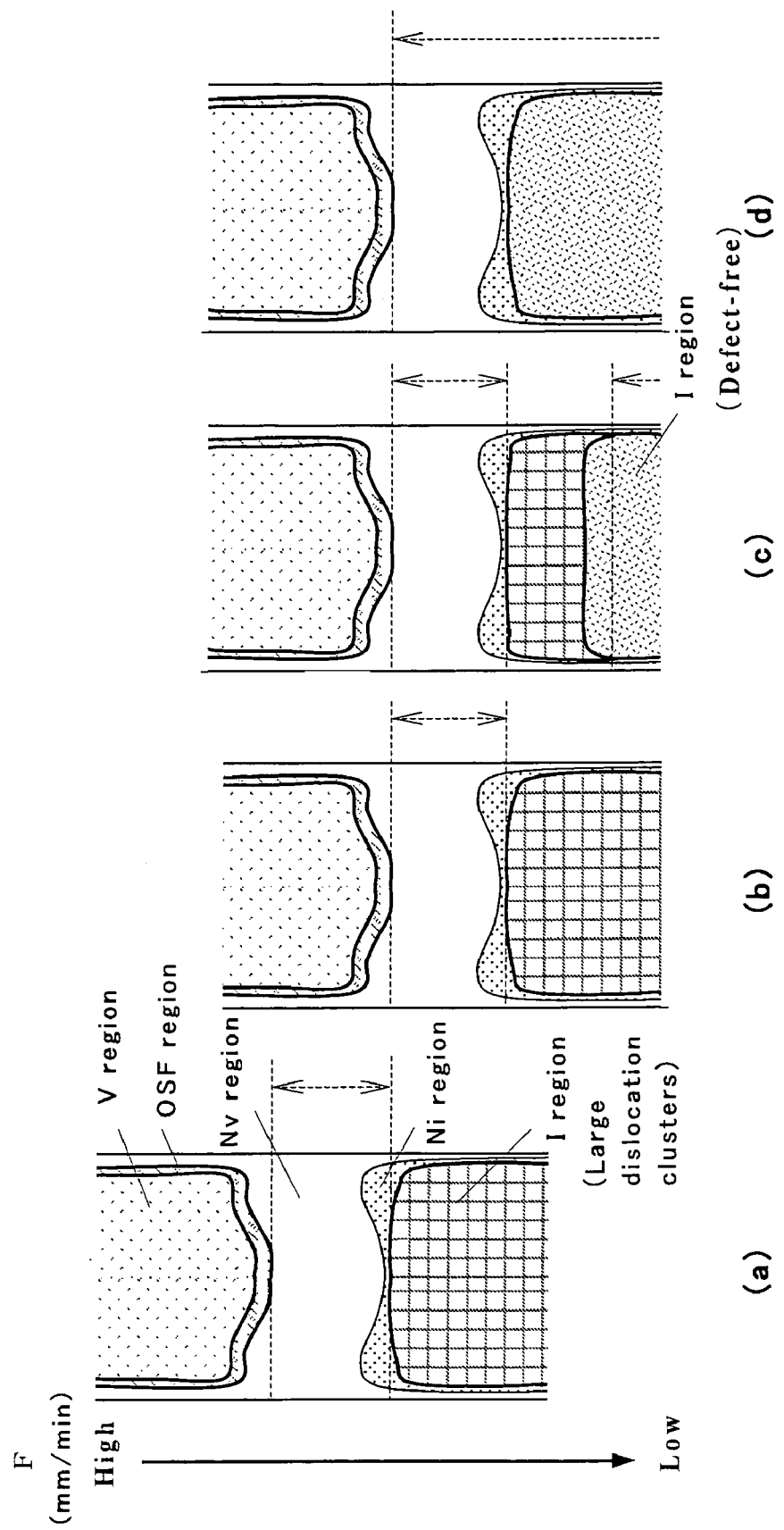
FIG. 1 is an explanatory view showing a relationship between a growth rate and a distribution of crystal defects under each condition.

(a) Pulling condition 5, (b) Pulling condition 3, (c) Pulling condition 4, (d) Pulling condition 1, Pulling condition 2.

Figure 2:
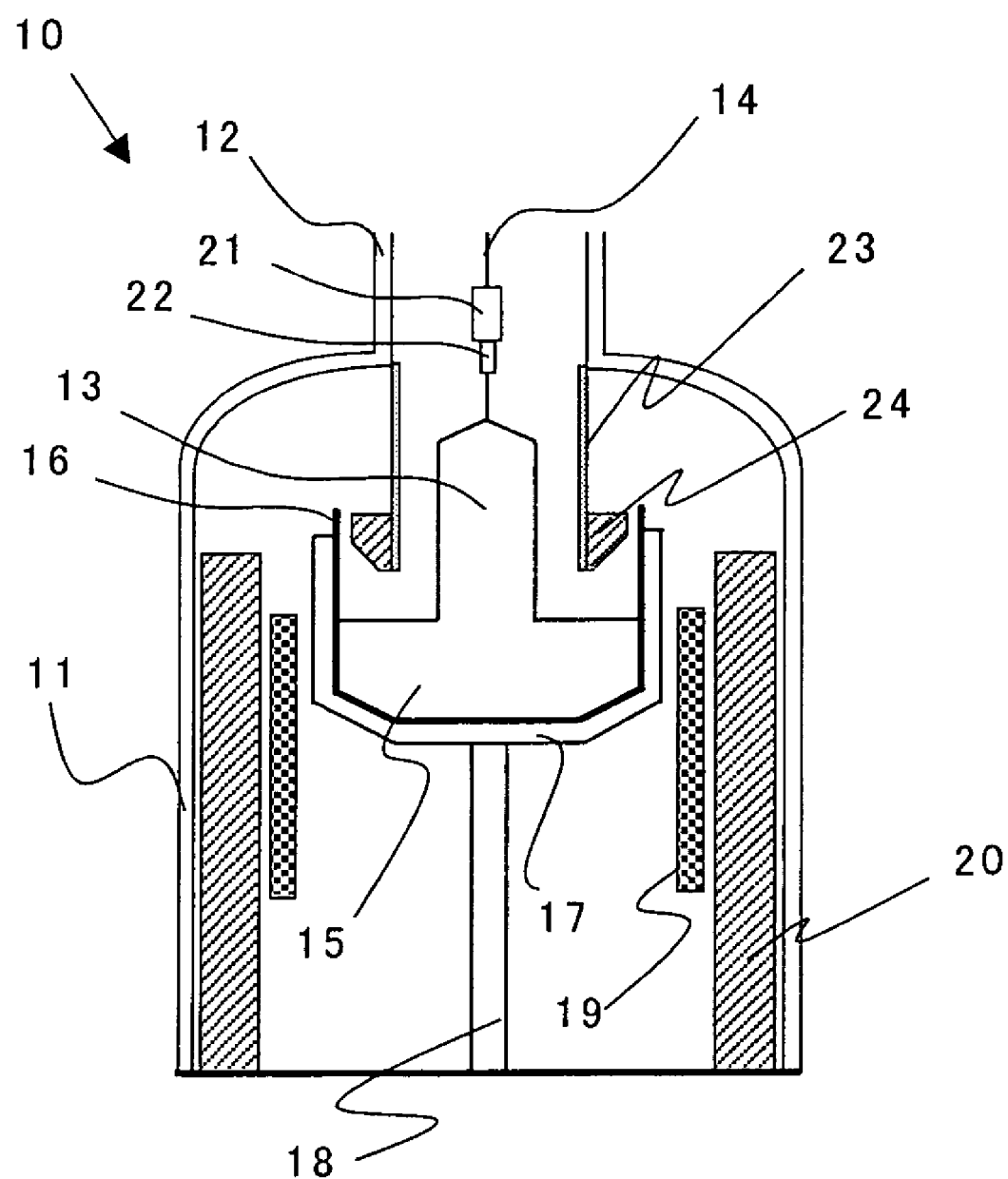

FIG. 2 is a schematic view of an apparatus for producing a single crystal.

Figure 3:
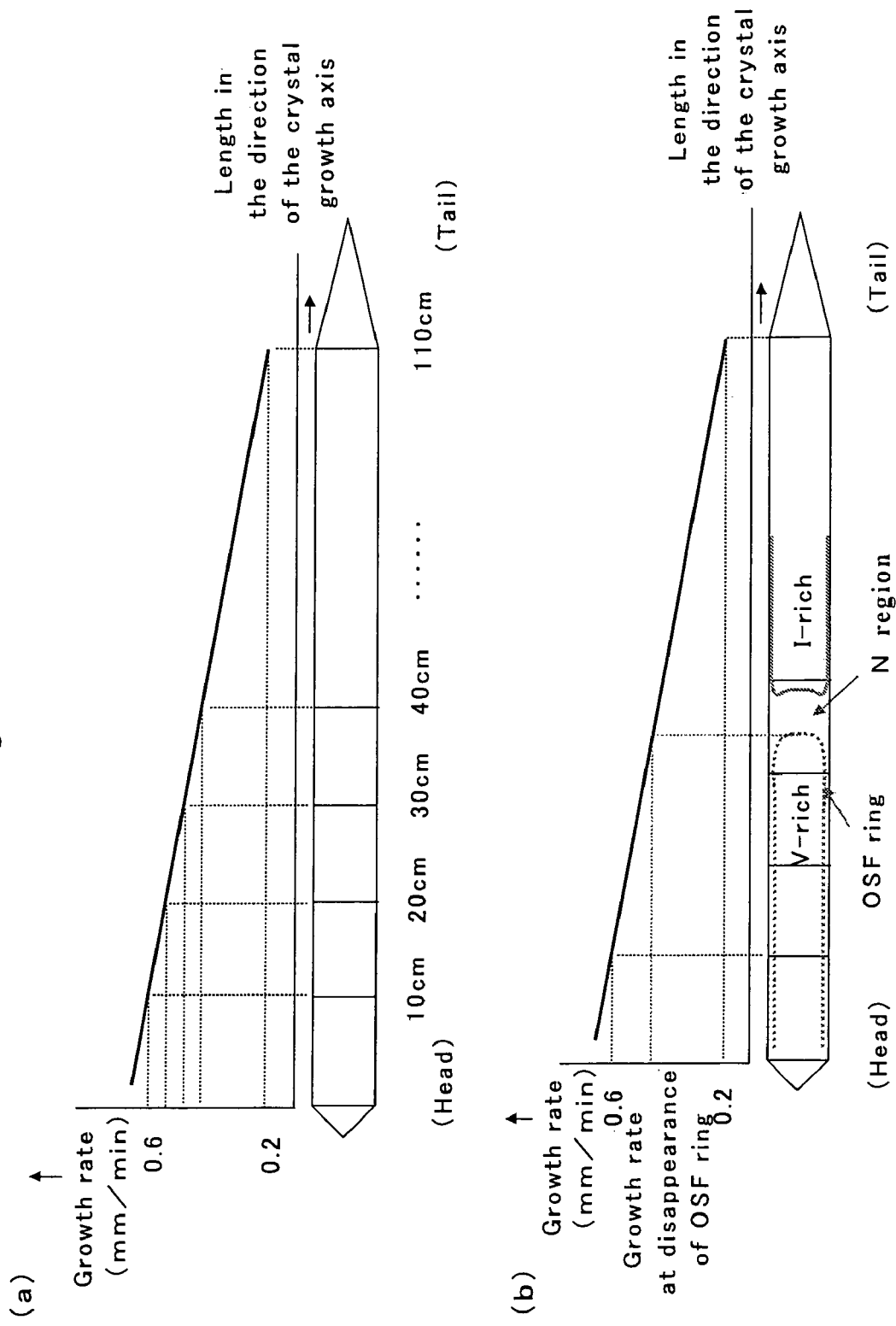

FIG. 3(a) is a view of showing relationship between a growth rate of a silicon single crystal and a cutting position of the crystal and (b) is an explanatory view showing a growth rate and each defect region.

Figure 4:
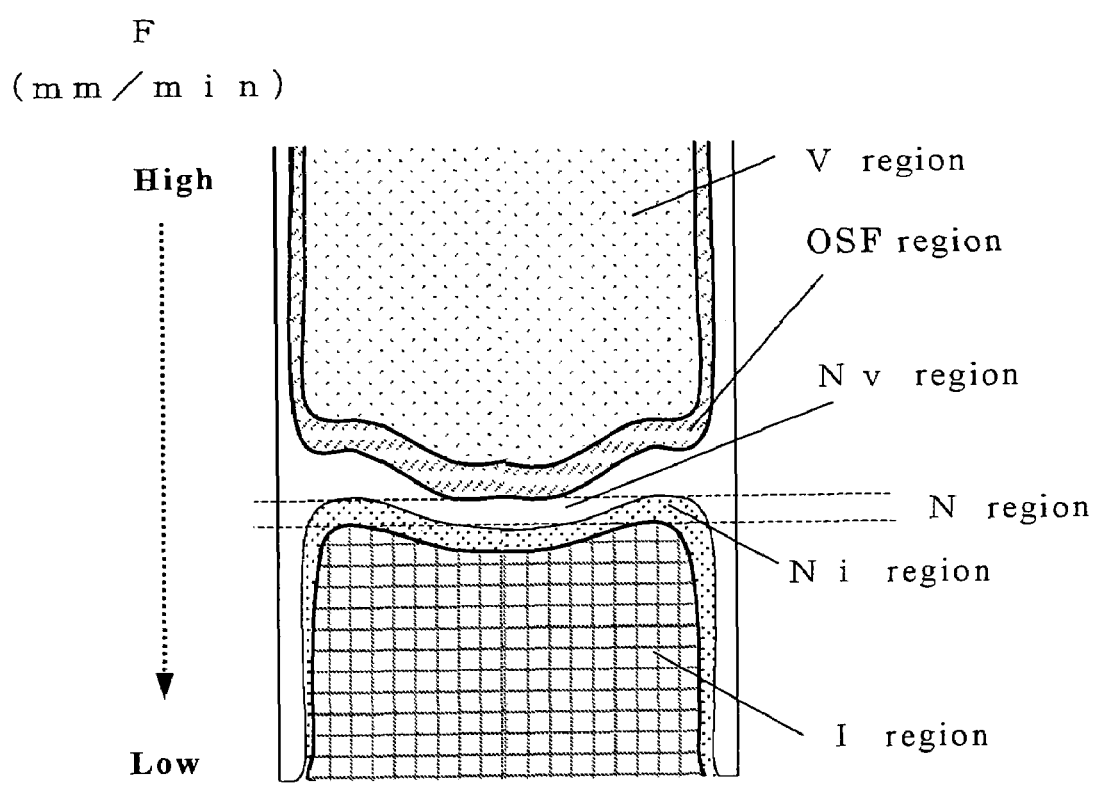

FIG. 4 is an explanatory view showing a relationship between a growth rate and a distribution of crystal defects according to a prior art.

Figure 5:
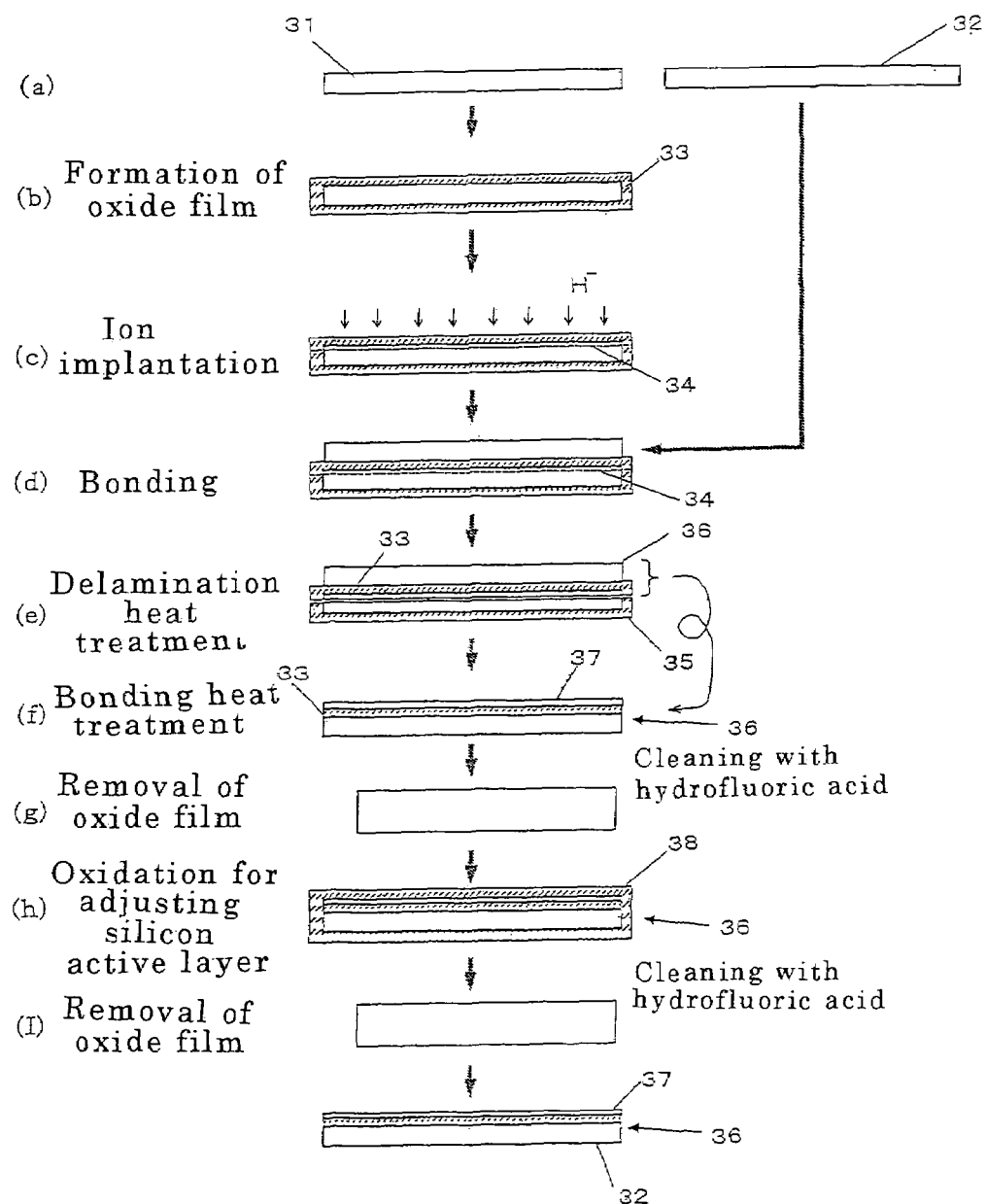

FIG. 5 is a flowchart showing an example of a manufacturing process of an SOI wafer according to the present invention by the ion implantation delamination method.

Figure 6:
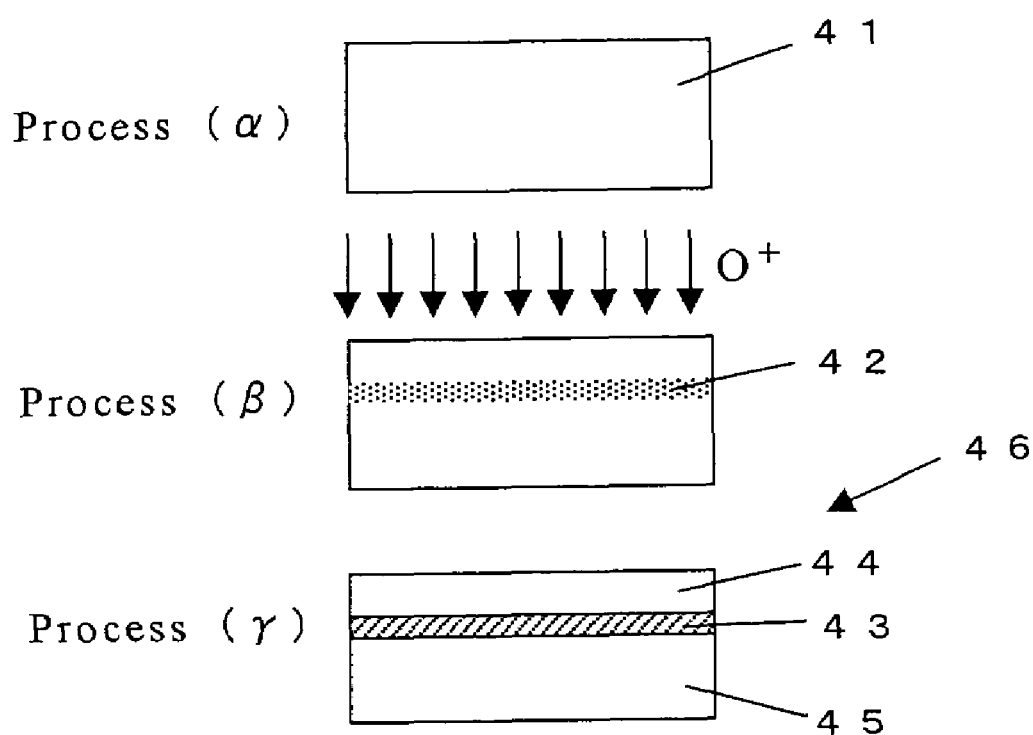

FIG. 6 is a flowchart showing an example of a manufacturing process of an SOI wafer according to the present invention by the SIMOX method.

BEST MODE FOR CARRYING OUT THE INVENTION

Hereinafter, embodiments of the present invention will be described. However, the present invention is not limited thereto.

An SOI wafer according to the present invention is an SOI wafer in which at least a silicon active layer is formed over a support substrate via an insulator film or on a support substrate directly, wherein, at least, the silicon active layer consists of a P(phosphorus)-doped silicon single crystal grown by Czochralski method, which is occupied by N region and/or defect-free I region, and contains Al (aluminum) with concentration of $2 \times 10^{12}$ atoms/cc or more.

As described above, in the case of the SOI wafer wherein the silicon active layer consists of a defect-free P-doped silicon single crystal, even an extremely fine defect hardly exists in the silicon active layer. And therefore, no micro pits are generated even when it is cleaned with hydrofluoric acid etc. and the problem that hydrofluoric acid infiltrates a buried oxide film through a pit and etches the film is not arisen. Thus, it becomes an SOI wafer having an excellent electric property.

In addition, an SOI wafer of the present invention is an SOI wafer in which a base wafer and a bond wafer respectively consisting of silicon single crystal are bonded via an insulator film, and then the bond wafer is thinned to form a silicon active layer, wherein the bond wafer and/or the base wafer consist of a P-doped silicon single crystal grown by Czochralski method, which is occupied by N region and/or defect-free I region, and contains Al with concentration of $2 \times 10^{12}$ atoms/cc or more.

As described above, in the case of the SOI wafer wherein the bond wafer to be a silicon active layer consists of a defect-free P-doped silicon single crystal, there does not exist even an extremely fine defect in the silicon active layer. And therefore, no micro pits are generated even when it is cleaned with hydrofluoric acid etc. and it becomes an SOI wafer having an excellent electric property.

Further, in the case of an SOI wafer wherein a base wafer to be a support substrate consists of a defect-free P-doped silicon single crystal, there does not exist micro defects on the surface of the base wafer. And therefore, even in the case of forming an extremely thin inter-layer insulator film, for example, with a thickness of 100 nm or less, degradation of dielectric breakdown property due to effect of the defects on the surface of the base wafer is not arisen, and such an SOI wafer has excellent electrical reliability in a device fabrication process.

In these SOI wafers according to the present invention, the silicon active layer can have a thickness in the range of 5 nm to 200 nm. In Recent years, the silicon active layer has been required to be thinner. In the case of the SOI wafer according to the present invention, since there hardly exist even an extremely fine defect in the silicon active layer, even if a thickness of the silicon active layer is 200 nm or less, it is prevented that the silicon active layer is destroyed due to enlargement of defects by cleaning with hydrofluoric acid and the like, and that buried oxide film is etched, so that there can be obtained an SOI wafer with high quality.

Further, the insulator film can be a silicon oxide film and can have a thickness in the range of 10 nm to 100 nm. In recent years, the thickness of the inter-layer insulator film consisting of silicon oxide film has been required to be 100 nm or less. In the case of the SOI wafer according to the present invention, even if such an extremely thin oxide film is formed, dielectric breakdown property is not deteriorated and excellent insulation property is retained.

The method for producing a defect-free P-doped silicon single crystal used for an SOI wafer of the present invention will be explained below.

When producing a B-doped silicon single crystal by Czochralski method, if a growth rate of the single crystal is gradually decreased from high rate to low rate from a shoulder of the crystal through a tail of a straight body thereof, the OSF shrinks with reaching certain growth rate, and thereafter, in a lower rate region, each phase of N region (Nv and Ni region) and I region is formed in the order. Particularly in I region of a lower rate side from N region, it is known that large dislocation clusters of which size is about 10 μm or more are formed, and defects such as LSEPD and LFPD are present. In addition, in the case of a B-doped silicon single crystal, N region is formed when a value of F/G ($mm^2/°$ C.·min) is in a range of 0.20-0.22.

On the other hand, when producing a P-doped silicon single crystal by Czochralski method, if a growth rate of a single crystal is gradually decreased from high rate to low rate from a shoulder of the crystal through a tail of a straight body thereof, the OSF shrinks with reaching certain growth rate, and thereafter, in a lower rate region, each phase of N region (Nv, Ni region) and I region is formed in the order. In the large dislocation clusters agglomeration in the I region, LFPD isn't contained but only LSEPD is contained. In addition, in the case of a P-doped silicon single crystal, N region is formed when a value of F/G ($mm^2/°$ C.·min) is in a range of 0.18-0.20.

As described above, it was found that a B-doped silicon single crystal and a P-doped silicon single crystal had different behaviors of a distribution of crystal defects. Particularly, in the case of a P-doped silicon single crystal, from the difference in the way of generation of crystal defects in I region, the inventors of the present invention found that Al elements taken in the pulling crystal after being eluted from a natural quartz crucible suppressed generation of the large dislocation clusters which were normally confirmed in I region.

When pulling a P-doped silicon single crystal, in the case of using a synthetic quartz crucible containing little Al components, the presence of the large dislocation clusters was confirmed in I region. However, when using such a natural quartz crucible that Al elements were taken in a pulling crystal in a concentration range of $5 \times 10^{11}$ atoms/cc or more to less than $2 \times 10^{12}$ atoms/cc, high-density LSEPD was confirmed in the I region of immediately lower rate side from Ni region, but LSEPD was not formed in a further lower rate region. Namely, it was found that the region was defect-free I region. Then, the present inventors examined Al concentration of I region in the vicinity of boundary where LSEPD disappeared. As a result, it was revealed that the concentration was about $2 \times 10^{12}$ atoms/cc, and at the time, a value of F/G ($mm^2/°$ C.·min) in the boundary was 0.17.

And, the present inventors used a synthetic quartz crucible based on the above fact, and added refined Al metal grains when filling polycrystalline silicon material so that Al elements of $2 \times 10^{12}$ atoms/cc or more could be taken in the pulling crystal. And, if a growth rate of a silicon single crystal was gradually decreased from high rate to low rate from a shoulder of the crystal through a tail of a straight body thereof, large dislocation clusters were not formed in the I region of an immediately lower rate side from Ni region, which was defect-free, and the I region of a further lower rate was also defect-free. Accordingly, it was found that in a P-doped crystal which is doped with Al, N region and defect-free I region are formed in the region where F/G ($mm^2/°$ C.·min) is 0.20, which corresponds to the boundary between OSF and N region, or less.

Here, a value of G (° C./mm), which is an average value of a temperature gradient in the pulling crystal along a pulling axis from the melting point of silicon to 1400° C., is calculated by using the global heat transfer analysis software FEMAG.

FEMAG is the global heat transfer analysis software disclosed in the reference (F. Dupret, P. Nicodeme, Y. Ryckmans, P. Wouters, and M. J. Crochet, Int. J. Heat Mass Transfer, 33, 1849 (1990)).

In addition, because Al is a conductivity type element of P-type, it is necessary to be careful about a high concentration doping. Particularly in order to dope Al without giving a disadvantage for device design, it is desirable to control a concentration of Al taken in a crystal not to be more than $1 \times 10^{14}$ atoms/cc.

Moreover, it is preferable to dope P so that a concentration of P in the P-doped silicon single crystal is $1 \times 10^{14}$ atoms/cc or more. This is because there can be obtained a sufficient N-type of conductivity if a concentration of doped P is $1 \times 10^{14}$ atoms/cc or more.

The SOI wafer according to the present invention is produced by using above produced defect-free P-doped silicon single crystal doped with proper doses of Al, and by using the bonding method like the ion implantation delamination method or the SIMOX method as described below.

FIG. 5 is a flowchart showing an example of a manufacturing process of an SOI wafer according to the present invention by the ion implantation delamination method.

First, in the first process (a), a bond wafer 31 that is to be a silicon active layer and a base wafer 32 that is to be a support substrate, are prepared. Here, in the present invention, as above mentioned, as the bond wafer 31 and/or the base wafer 32, a silicon wafer consisting of P-doped silicon single crystal grown by Czochralski method, which is occupied by N region and/or defect-free I region, and contains Al with concentration of $2 \times 10^{12}$ atoms/cc or more is used.

The above-mentioned P-doped silicon single crystal which is occupied by N region and/or defect-free I region, and contains Al with concentration of $2 \times 10^{12}$ atoms/cc or more can be grown, for example, by using an apparatus 10 for producing a single crystal as shown FIG. 2 and controlling F/G and doping dose of Al.

Next, in the process (b) of FIG. 5, a surface of at least either of the bond wafer 31 or the base wafer 32 is oxidized. The bond wafer 31 can be thermally oxidized herein to form an oxide film 33 on the surface. At this time, although the oxide film 33 has a thickness to retain required insulation property, in the present invention, an extremely thin oxide film having a thickness in the range of 10 nm-100 nm can be formed.

When an SOI wafer is produced by using conventionally used wafer such as a silicon wafer on the surface of which there are many micro defects with a size of 50 nm or more as a base wafer and forming a buried oxide film with a thickness of 100 nm or less, there is a possibility that the oxide film could be adversely affected by the micro defects present on the surface of the base wafer and could be deteriorated or destroyed by the following bonding heat treatment or heat-treatment in a device fabrication process. However, since the base wafer 32 used in the present invention hardly has even an extremely fine defect, problems like degradation of dielectric breakdown property is not arisen even if the oxide film 33 has a thickness of 100 nm or less.

In addition, when the oxide film 33 has a thickness of less than 10 nm, necessary time to form the oxide film shortens, but there is a possibility that an insulation property cannot be retained. Therefore, it is preferable that the thickness of the oxide film is 10 nm or more.

In the process (c), hydrogen ions are implanted from one surface of the bond wafer 31 on the surface of which the oxide film 33 is formed. Rare gas ions or mixture gas ions of hydrogen ions and rare gas ions may also be implanted. Thereby, an ion-implanted layer 34 parallel to the surface of the wafer at an average penetration depth of ions can be formed inside the wafer. The depth of the ion-implanted layer 34 will be reflected in a thickness of a silicon active layer to be formed finally. Accordingly, by implanting ions with controlling implantation energy etc., it is possible to control a thickness of a silicon active layer, for example, 5 nm-3000 nm. Especially a silicon active layer having a thickness of 200 nm or less can be made.

The grown-in defects are hardly detected in the bond wafer 31 used in the present invention. Therefore, even in the case that the silicon active layer has a thickness of 200 nm or less, micro pits are not generated when the wafer is subjected to cleaning with hydrofluoric acid, thus there can be obtained an SOI wafer which has an excellent electrical property.

In the process (d), the surface of the ion-implanted side of the bond wafer 31 and a surface of the base wafer 32 are bonded together via the oxide film (the insulator film) 33. For example, by contacting surfaces of two wafers 31 and 32 with each other under a clean atmosphere at room temperature, both wafers are joined without an adhesive agent, or the like.

In addition, as the base wafer, an insulator wafer such as $SiO_2$, SiC and $Al_2O_3$ may also be used. In this case, the bond wafer and the base wafer can be bonded directly without the oxide film.

Next, in the process (e), a part of the bond wafer 31 is delaminated at the ion-implanted layer 34 by heat treatment. For example, when the wafer in which the bond wafer 31 and the base wafer 32 are bonded together are subjected to heat treatment under an inert gas atmosphere at a temperature of about 500° C. or more, the wafer is separated into a delaminated wafer 35 and an SOI wafer 36 (a silicon active layer 37+an oxide film 33+the base wafer 32) due to rearrangement of the crystal and aggregation of bubbles.

Here, as for the delaminated wafer 35 produced as by-product above, there has been recently proposed a method to reclaim the delaminated wafer 35 as a base wafer or a bond wafer by being subjected to reclaiming process such as polishing a delaminating plane. As mentioned above, in the case that a P-doped silicon wafer doped with Al which is occupied by N region and/or defect-free I region is used as the bond wafer 31, a silicon wafer which is obtained by reclaiming a delaminated wafer 35 can be used as a base wafer or a bond wafer. Accordingly, by reclaiming a delaminated wafer 35 for example as a base wafer 32, an SOI wafer having the same high quality can be produced. Thus, an SOI wafer according to the present invention can be produced from substantially one silicon wafer, thereby production cost can be much more lowered.

In the process (f), the SOI wafer 36 is subjected to bonding heat treatment. In this process (f), since bonding strength between the wafers brought into close contact in the aforementioned bonding step (d) and the delamination heat treatment step (e) is too weak to be used as it is in a device fabrication process, the SOI wafer 36 is subjected to heat treatment at high temperature as bonding heat treatment to be sufficient bonding strength. For example, this heat treatment can be performed in a range from 30 minutes to 2 hours at 1050° C.-1200° C. under an inert gas atmosphere.

Such high temperature heat treatment doesn't deteriorate the dielectric breakdown property of the buried oxide film 33 since whole plane of the base wafer 32 is defect-free, thus high insulation property can be retained.

In the process (g), an oxide film formed on the surface of the SOI wafer 36 is removed by cleaning with hydrofluoric acid. At this time, if vacancy type defects exist in the silicon active layer 37, there is a possibility that HF reaches a buried oxide film through the defects and thereby micro pits are generated. However, in the present invention, since the silicon active layer 37 consists of P-doped silicon single crystal whole plane of which is occupied by N region and/or defect-free I region, there is no possibility that pits are enlarged and that the silicon active layer 37 and the oxide film 33 are destroyed in the case of being subjected to cleaning with hydrofluoric acid.

Further, in the process (h), according to need, oxidation for adjusting a thickness of the silicon active layer 37 is performed and subsequently in the process (I), so-called sacrificial oxidation in which an oxide film 38 is removed by cleaning with hydrofluoric acid is performed.

As for the SOI wafer manufactured through the processes (a)-(I) as described above, the whole plane of a base wafer 32 and further that of a silicon active layer 37 consist of a P-doped silicon single crystal which is occupied by N region and/or defect-free I region, and an Al-doped CZ silicon single crystal. Thereby, although the buried oxide film 33 is extremely thin, a high insulation property can be retained, and the SOI wafer has extremely high electrical reliability.

FIG. 6 is a flowchart showing an example of a manufacturing-process of an SOI wafer according to the present invention by the SIMOX method.

First, in the first process (α), a mirror-polished silicon wafer 41 is prepared. In the present invention, as mentioned above, a silicon wafer consisting of P-doped silicon single crystal grown by Czochralski method, which is occupied by N region and/or defect-free I region, and contains Al with concentration of $2 \times 10^{12}$ atoms/cc or more is used as the silicon wafer 41.

Next, in the process (β), oxygen ions ($O^+$) are ion-implanted at a given depth from one side surface of the silicon wafer 41 heated up to around 500° C. to form an oxygen ion implanted layer 42. At this time, although a condition for implanting ions is not limited particularly, for example, ion implantation is performed with implantation energy of around 150-200 keV which is generally and widely used, and with low dose of around $4.0 \times 10^{17}/cm^2$ for preventing generation of penetrating dislocation in the following heat-treatment for forming an oxide film. At this time, implantation of oxygen ions can be performed by installments if necessary.

Next, in the process (γ), heat-treatment for forming an oxide film by which an oxygen ion implanted layer 42 is transformed into a buried oxide film 43 is performed. Although a condition for the heat-treatment for forming an oxide film is not limited particularly as long as being able to transform an oxygen ion implanted layer into a buried oxide film, for example, a buried oxide film (an insulator film) 43 can be formed by performing heat-treatment for 3-6 hours with temperature from 1300° C. to melting point of silicon under Argon gas atmosphere containing oxygen with a concentration of 1% or less. As mentioned above, an SOI wafer 46 in which a silicon active layer 44 is formed over a support substrate 45 via an insulator film 43 can be produced.

As mentioned above, as for an SOI wafer produced by the SIMOX method, since a thickness of a silicon active layer and a buried oxide film are decided by ion implantation energy and dose, there is also an advantage that excellent uniformity of film thickness can be easily obtained. Further, since an SOI wafer can be produced from one silicon wafer unlike the bonding method that needs 2 wafers, an SOI wafer can be produced at relatively low cost.

Hereinafter, the present invention will be explained further in detail with reference to Examples and Comparative Examples.

[Confirmation of Pulling Conditions]

(Pulling Condition 1)

A silicon single crystal was produced by using an apparatus for producing a single crystal as shown in FIG. 2. 150 kg of polycrystalline silicon material and 4 mg of refined Al metal grains were charged in a quartz crucible having a diameter of 24 inches (600 mm), and a silicon single crystal having a diameter of 210 mm and orientation of <100> was grown. When pulling the silicon single crystal, a growth rate was controlled to be gradually lowered from a head to a tail of the crystal in the range from 0.60 mm/min to 0.20 mm/min. In addition, P concentration was controlled in the range of $3 \times 10^{14}$-$5.5 \times 10^{14}$ atoms/cc and Oxygen concentration was controlled in the range of 24-27 ppma (ASTM'79 value) to produce the silicon single crystal.

Then, as shown in FIG. 3(a), a straight body of each silicon single crystal ingot above grown was cut into blocks by each length of 10 cm in the direction of the crystal growth, and after that, each block was cut lengthwise along the crystal axis and several samples having a thickness of around 2 mm were produced.

As to the above samples, a distribution of each region of V region, OSF region, N region and I region (See, FIG. 3(b)), namely a distribution of FPD, LFPD, LSEPD or the like, and generation of OSF were measured by means of WLT measuring instrument (SEMILAB WT-85) and Secco etching, and a value of F/G ($mm^2/°$ C.·min) in the boundary of each region was confirmed.

Specifically, first, with respect to evaluation of FPD, LFPD and LSEPD, one of samples was subjected to a surface grinding, and then it was subjected to mirror etching and Secco etching (for 30 minutes), and left without stirring, and after a predetermined treatment, density of each defect was measured. Moreover, with respect to evaluation of OSF, one of the samples was subjected to heat treatment at 1150° C. for 100 minutes (under wet-oxidizing atmosphere) and then cooled down (set in and out at 800° C.), and after an oxide film was removed by chemical solution, OSF ring pattern was confirmed and density thereof was measured.

Furthermore, slab samples being cut longitudinally along the crystal axis were cut to have a size of diameter of 200 mm. And the samples were finished to be a mirror state by polishing, and after an oxide thin film was formed on the wafer surface by pyrogenic oxidation at 900° C., heavy metals in the oxide film were collected by the thermal sulfuric acid, and Al concentration contained in the crystal bulk was identified from the measured value in the solution by WSA method.

More detailed distribution of each region which was found from the above-described measurement is shown in FIG. 1(d). F/G ($mm^2/°$ C.·min) and an Al concentration in boundaries of each region are shown as follows.

F/G ($mm^2/°$ C.·min) in the boundary between OSF region and N region: 0.20

F/G ($mm^2/°$ C.·min) in the boundary between N region and (defect-free) I region: 0.18 an Al concentration in the crystal bulk near F/G=0.17: $4.1 \times 10^{12}$ atoms/cc.

(Pulling Condition 2)

A silicon single crystal was produced and each measurement was performed as the same with Example 1 except for charging 150 kg of polycrystalline silicon material and 8 mg of refined Al metal grains in a quartz crucible.

More detailed distribution of each region which was found from the above-described measurement is shown in FIG. 1(d). F/G ($mm^2/°$ C.·min) and an Al concentration in boundaries of each region are shown as follows.

F/G ($mm^2/°$ C.·min) in the boundary between OSF region and N region: 0.20

F/G ($mm^2/°$ C.·min) in the boundary between N region and (defect-free) I region: 0.18 an Al concentration in the crystal bulk near F/G=0.17: $8.8 \times 10^{12}$ atoms/cc.

(Pulling Condition 3)

A silicon single crystal was produced and each measurement was performed as the same with Example 1 except for charging 150 kg of polycrystalline silicon material without Al metal grains in a quartz crucible.

More detailed distribution of each region which was found from the above-described measurement is shown in FIG. 1(b). F/G ($mm^2/°$ C.·min) and an Al concentration in boundaries of each region are shown as follows.

F/G ($mm^2/°$ C.·min) in the boundary between OSF region and N region: 0.20

F/G (mm²/° C.·min) in the boundary between N region and (large dislocation clusters-formed) I region: 0.18 an Al concentration in the crystal bulk near F/G=0.17: $1 \times 10^8$ atoms/cc.

(Pulling Condition 4)

A silicon single crystal was produced and each measurement was performed as the same with Example 1 except for charging 150 kg of polycrystalline silicon material and 2 mg of refined Al metal grains in a quartz crucible.

More detailed distribution of each region which was found from the above-described measurement is shown in FIG. 1(c). F/G (mm²/° C.·min) and an Al concentration in boundaries of each region are shown as follows.

F/G (mm²/° C.·min) in the boundary between OSF region and N region: 0.20

F/G (mm²/° C.·min) in the boundary between N region and (large dislocation clusters-formed) I region: 0.18

F/G (mm²/° C.·min) in the boundary between (large dislocation clusters-formed) I region and (defect-free) I region: 0.17 an Al concentration in the crystal bulk near F/G=0.17: $1.8 \times 10^{12}$ atoms/cc.

(Pulling Condition 5)

A silicon single crystal was produced and each measurement was performed as the same with Example 1 except for charging 150 kg of polycrystalline silicon material and 4 mg of refined Al metal grains in a quartz crucible and producing the silicon single crystal so that a B (Boron) concentration is $1 \times 10^{15}$-$1.5 \times 10^{15}$ atoms/cc.

More detailed distribution of each region which was found from the above-described measurement is shown in FIG. 1(a). F/G (mm²/° C.·min) and an Al concentration in boundaries of each region are shown as follows.

F/G (mm²/° C.·min) in the boundary between OSF region and N region: 0.22

F/G (mm²/° C.·min) in the boundary between N region and (large dislocation clusters-formed) I region: 0.20 an Al concentration in the crystal bulk near F/G=0.17: $3.8 \times 10^{12}$ atoms/cc.

As it is clear from FIG. 1, in the case of a P-doped silicon single crystal, in Pulling condition 3 and Pulling condition 4 where an Al concentration was less than $2 \times 10^{12}$ atoms/cc, large dislocation clusters were formed in I region, and even if defect-free I region was present, it remained partially (FIG. 1(b), (c)). However, in Pulling condition 1 and Pulling condition 2 where an Al concentration was $2 \times 10^{12}$ atoms/cc or more, I region became defect-free as shown in FIG. 1(d), and the whole plane at the lower rate side from the boundary between OSF and N region became defect-free region.

On the other hand, in the case of B-doped silicon single crystal, as Pulling condition 5, even if an Al concentration was $2 \times 10^{12}$ atoms/cc or more, large dislocation clusters were formed in I region as shown in FIG. 1(a), and defect-free I region was not appeared.

[Production of an SOI Wafer]

EXAMPLE 1

With the above-mentioned pulling condition 1, a P-doped silicon single crystal whole plane of which was occupied by N region and defect-free I region was produced by controlling pulling rate F so that F/G (mm²/° C.·min) is in the range of 0.19-0.13. Mirror surface wafers were produced from this P-doped silicon single crystal and used as a bond wafer.

Next, with the pulling condition 3, a P-doped silicon single crystal whole surface of which was occupied by V region was produced by controlling pulling rate F so that F/G (mm²/° C.·min) is in the range of 0.27-0.24. Mirror wafers were produced from this P-doped silicon single crystal and used as a base wafer.

By using thus prepared bond wafer and base wafer, according to ion implantation delamination method based on the process shown in FIG. 5, ion implantation into the bond wafer, bonding the bond wafer with the base wafer, delaminating heat-treatment, bonding heat treatment (a bonding oxidation), removal of the oxide film, oxidation for adjusting the silicon active layer, removal of the oxide film and the like were performed. Thus, an SOI wafer having an insulator film with a thickness of 200 nm and a silicon active layer with a thickness of 50 nm was produced.

The surface of the silicon active layer of this SOI wafer was measured with a particle counter (Surfscan SP-1, manufactured by KLA-Tencor Corporation). As a result, in spite of removing the thermal oxide film by cleaning with hydrofluoric acid after oxidation for adjusting the silicon active layer, it was confirmed that etch pits were not formed in the silicon active layer and the silicon active layer was not destroyed.

EXAMPLE 2

With the above-mentioned pulling condition 1, a P-doped silicon single crystal whole plane of which was occupied by N region and defect-free I region was produced by controlling pulling rate F so that F/G (mm²/° C.·min) is in the range of 0.19-0.13. Mirror wafers were produced from this P-doped silicon single crystal and used as a bond wafer and a base wafer.

By using thus prepared bond wafer and base wafer, by the same ion implantation delamination method as performed in example 1, an SOI wafer having a silicon active layer with a thickness of 50 nm, and an insulator film with a thickness of 70 nm was produced. Then the surface of the silicon active layer was measured with a particle counter, and it was confirmed that etch pits were not formed in the silicon active layer and the silicon active layer was not destroyed.

Further, the silicon active layer of the SOI wafer was removed by preferential etching with a solution of potassium hydroxide. Then, the base wafer having remaining insulator film was evaluated by Cu deposition method with an electric field intensity of 6 MV/cm. As a result, it was confirmed that the insulator film was defect-free, and that destruction of the insulator film was not happened.

COMPARATIVE EXAMPLE 1

With the above-mentioned pulling condition 3, a P-doped silicon single crystal whole plane of which was occupied by V region was produced by controlling pulling rate F so that F/G (mm²/° C.·min) is in the range of 0.27-0.24. Mirror wafers were produced from this P-doped silicon single crystal and used as a bond wafer and a base wafer.

By using thus prepared bond wafer and base wafer, by the same method as example 1, an SOI wafer having an insulator film with a thickness of 200 nm and a silicon active layer with a thickness of 50 nm was produced. Then the surface of the silicon active layer of this SOI wafer was measured with a particle counter, and high-density light dots that showed the destruction of the silicon active layer were confirmed.

COMPARATIVE EXAMPLE 2

With the above-mentioned pulling condition 3, a P-doped silicon single crystal whole plane of which was occupied by V region was produced by controlling pulling rate F so that F/G (mm$^2$/° C.·min) is in the range of 0.27-0.24. Mirror surface wafers were produced from this P-doped silicon single crystal and used as a bond wafer and a base wafer.

By using thus prepared bond wafer and base wafer, by the same method as example 2, an SOI wafer having a silicon active layer with a thickness of 50 nm, an insulator film with a thickness of 70 nm was produced. Then the surface of the silicon active layer of this SOI wafer was measured with a particle counter, and high-density light dots that showed the destruction of the silicon active layer were confirmed. Further, after removing the silicon active layer, the insulator film was evaluated by Cu deposition method. And high-density defects of oxide film that shows the destruction of the insulator film was confirmed.

In addition, the present invention is not limited to the embodiment described above. The above-described embodiment is mere an example, and those having substantially the same structure as technical ideas described in the appended claims and providing the similar functions and advantages are included in the scope of the present invention.

The invention claimed is:

1. An SOI wafer in which at least a silicon active layer is formed over a support substrate via an insulator film or on a support substrate directly, wherein, at least, the silicon active layer consists of a P(phosphorus)-doped silicon single crystal grown by Czochralski method, wherein the whole plane of the silicon active layer is occupied by (i) a defect-free I region or (ii) a N region and a defect-free I region, and doped with P (phosphorus) entirely and uniformly, and contains Al (aluminum) doped by Czochralski method entirely and uniformly, with concentration of $2\times10^{12}$ atoms/cc or more.

2. An SOI wafer in which a base wafer and a bond wafer respectively consisting of silicon single crystal are bonded via an insulator film, and then the bond wafer is thinned to form a silicon active layer, wherein the bond wafer and/or the base wafer consists of a P-doped silicon single crystal grown by Czochralski method, wherein the whole plane of the silicon active layer is occupied by (i) a defect-free I region or (ii) a N region and a defect-free I region, and doped with P entirely and uniformly, and contains Al doped by Czochralski method entirely and uniformly, with concentration of $2\times10^{12}$ atoms/cc or more.

3. The SOI wafer according to claim 1, wherein the P-doped silicon single crystal contains P with concentration of $1\times10^{14}$ atoms/cc or more.

4. The SOI wafer according to claim 2, wherein the P-doped silicon single crystal contains P with concentration of $1\times10^{14}$ atoms/cc or more.

5. The SOI wafer according to claim 1, wherein the silicon active layer has a thickness in the range of 5 nm to 200 nm.

6. The SOI wafer according to claim 2, wherein the silicon active layer has a thickness in the range of 5 nm to 200 nm.

7. The SOI wafer according to claim 1, wherein the insulator film is a silicon oxide film and has a thickness in the range of 10 nm to 100 nm.

8. The SOI wafer according to claim 2, wherein the insulator film is a silicon oxide film and has a thickness in the range of 10 nm to 100 nm.

9. A method for producing an SOI wafer in which at least an insulator film layer (an oxide film layer) is formed by implanting oxygen into a silicon wafer and then performing heat-treatment, to form a silicon active layer insulated by the insulator film layer in the wafer, wherein at least a silicon wafer which consists of a P-doped silicon single crystal grown by Czochralski method, wherein the whole plane of the silicon active layer is occupied by (i) a defect-free I region or (ii) a N region and a defect-free I region, and doped with P entirely and uniformly, and contains Al doped by Czochralski method entirely and uniformly, with concentration of $2\times10^{12}$ atoms/cc or more is used as the silicon wafer.

10. A method for producing an SOI wafer at least comprising steps of, a bonding step bonding a base wafer and a bond wafer directly and a thinning step forming a silicon active layer by thinning the bond wafer, wherein an insulator substrate is used as the base wafer and a silicon wafer which consists of a P-doped silicon single crystal grown by Czochralski method, wherein the whole plane of the silicon active layer is occupied by (i) a defect-free I region or (ii) a N region and a defect-free I region, and doped with P entirely and uniformly, and contains Al doped by Czochralski method entirely and uniformly, with concentration of $2\times10^{12}$ atoms/cc or more is used as the bond wafer.

11. A method for producing an SOI wafer at least comprising steps of, a bonding step bonding a base wafer and a bond wafer respectively consisting of silicon single crystal via an insulator film and a thinning step forming a silicon active layer by thinning the bond wafer, wherein a silicon wafer which consists of a P-doped silicon single crystal grown by Czochralski method, wherein the whole plane of the silicon active layer is occupied by (i) a defect-free I region or (ii) a N region and a defect-free I region, and doped with P entirely and uniformly, and contains Al doped by Czochralski method entirely and uniformly, with concentration of $2\times10^{12}$ atoms/cc or more is used as the bond wafer and/or the base wafer.

12. The method for producing an SOI wafer according to claim 10, wherein, ahead of the bonding step, ion implanting step is performed to form an ion implanted layer in the bond wafer by implanting at least one type of ion from among hydrogen ion and rare gas ions from the surface of the bond wafer, in the bonding step, the surface of the ion-implanted side of the bond wafer and the surface of the base wafer are bonded directly or via the insulator film, and in the thinning step, a part of the bond wafer is delaminated at the ion-implanted layer by heat-treatment.

13. The method for producing an SOI wafer according to claim 11, wherein, ahead of the bonding step, ion implanting step is performed to form an ion implanted layer in the bond wafer by implanting at least one type of ion from among hydrogen ion and rare gas ions from the surface of the bond wafer, in the bonding step, the surface of the ion-implanted side of the bond wafer and the surface of the base wafer are bonded directly or via the insulator film, and in the thinning step, a part of the bond wafer is delaminated at the ion-implanted layer by heat-treatment.

14. The method for producing an SOI wafer according to claim 9, wherein, as the P-doped silicon single crystal, a crystal containing P with concentration of $1\times10^{14}$ atoms/cc or more is used.

15. The method for producing an SOI wafer according to claim 10, wherein, as the P-doped silicon single crystal, a crystal containing P with concentration of $1\times10^{14}$ atoms/cc or more is used.

16. The method for producing an SOI wafer according to claim 11, wherein, as the P-doped silicon single crystal, a crystal containing P with concentration of $1\times10^{14}$ atoms/cc or more is used.

17. The method for producing an SOI wafer according to claim 9, wherein a thickness of the silicon active layer is in the range of 5 nm to 200 nm.

18. The method for producing an SOI wafer according to claim 10, wherein a thickness of the silicon active layer is in the range of 5 nm to 200 nm.

19. The method for producing an SOI wafer according to claim 11, wherein a thickness of the silicon active layer is in the range of 5 nm to 200 nm.

20. The method for producing an SOI wafer according to claim 9, wherein the insulator film is a silicon oxide film and a thickness of the silicon oxide film is in the range of 10 nm to 100 nm.

21. The method for producing an SOI wafer according to claim 11, wherein the insulator film is a silicon oxide film and a thickness of the silicon oxide film is in the range of 10 nm to 100 nm.

22. The SOI wafer according to claim 1, wherein the whole plane of the silicon active layer is occupied by a defect-free I region.

23. The SOI wafer according to claim 2, wherein the whole plane of the silicon active layer is occupied by a defect-free I region.

24. The method for producing an SOI wafer according to claim 9, wherein the whole plane of the silicon active layer is occupied by a defect-free I region.

25. The method for producing an SOI wafer according to claim 10, wherein the whole plane of the silicon active layer is occupied by a defect-free I region.

26. The method for producing an SOI wafer according to claim 11, wherein the whole plane of the silicon active layer is occupied by a defect-free I region.

\* \* \* \* \*